US012707617B2

(12) United States Patent
Englert et al.

(10) Patent No.: US 12,707,617 B2
(45) Date of Patent: Aug. 11, 2026

(54) PRESS-IN MACHINE FOR PRESSING COMPONENTS INTO A SUBSTRATE, IN PARTICULAR INTO A PRINTED CIRCUIT BOARD OR CARRIER PLATE, WITH SUBSTRATE POSITIONING

(71) Applicant: ERSA GmbH, Wertheim (DE)

(72) Inventors: Kathrin Englert, Marktheidenfeld (DE); Lothar Schwab, Bischbrunn (DE); Sebastian Becker, Erlenbach (DE); Kevin Friedrich, Wertheim (DE)

(73) Assignee: ERSA GmbH, Wertheim (DE)

( * ) Notice: Subject to any disclaimer, the term of this patent is extended or adjusted under 35 U.S.C. 154(b) by 798 days.

(21) Appl. No.: 17/980,206

(22) Filed: Nov. 3, 2022

(65) Prior Publication Data

US 2023/0139895 A1 May 4, 2023

(30) Foreign Application Priority Data

Nov. 4, 2021 (DE) ..................... 10 2021 128 724.3

(51) Int. Cl.
*H05K 13/04* (2006.01)
*H05K 3/306* (2026.01)
*H05K 13/08* (2006.01)

(52) U.S. Cl.
CPC ............. *H05K 13/04* (2013.01); *H05K 3/306* (2013.01); *H05K 13/0812* (2018.08);
(Continued)

(58) Field of Classification Search
CPC ........... H05K 13/04; H05K 2201/1059; H05K 3/306; H05K 3/308
See application file for complete search history.

(56) References Cited

U.S. PATENT DOCUMENTS 3,932,931 A * 1/1976 Wright ................... H05K 13/04 29/842
2013/0106041 A1* 5/2013 Noda ...................... B41F 33/14 269/58

(Continued)

FOREIGN PATENT DOCUMENTS

CN 103085450 A 5/2013
CN 212727917 U 3/2021

OTHER PUBLICATIONS

DE Examination Report, dated Oct. 6, 2022, File No. 102021128724. 3, pp. 1-5.

(Continued)

*Primary Examiner* — Livius R. Cazan
(74) *Attorney, Agent, or Firm* — BOND, SCHOENECK & KING, PLLC; George R. McGuire

(57) ABSTRACT

A press-in machine for pressing electrical, electronic, mechanical and/or electromechanical components into a substrate, in particular into a printed circuit board or carrier plate, and method therefor, including a moving unit, which comprises a receptacle for a substrate and with which the substrate can be moved in a plane, which is spanned by an x-axis and a y-axis and can be placed in a press-in position in which one or more components are pressed into the substrate, a lower tool, which comes to rest against the underside of the substrate before or during the press-in, an upper tool, which can be moved against the component for pressing the component along the z axis toward the substrate, a control unit for controlling the moving unit, and a sensor for detecting at least one reference mark present on the substrate, wherein the control unit is configured and designed such that it controls the moving unit depending on the detected reference mark in such a way that the substrate (Continued)

is placed between the lower tool and the upper tool in the press-in position.

12 Claims, 2 Drawing Sheets

(52) U.S. Cl.
CPC . *H05K 13/0815* (2018.08); *H05K 2201/1059* (2013.01); *H05K 2203/0195* (2013.01); *H05K 2203/1509* (2013.01); *H05K 2203/166* (2013.01)

(56) References Cited

U.S. PATENT DOCUMENTS

| | | | | |
|---|---|---|---|---|
| 2018/0027655 | A1 | 1/2018 | Brockerhoff et al. | |
| 2019/0322064 | A1* | 10/2019 | Borisuk ............... | H01R 43/205 |
| 2020/0113095 | A1 | 4/2020 | Kanda et al. | |

OTHER PUBLICATIONS

English Translation of CN Office Action for application No. 202211428424.9, Office Action dated Nov. 18, 2023.

* cited by examiner

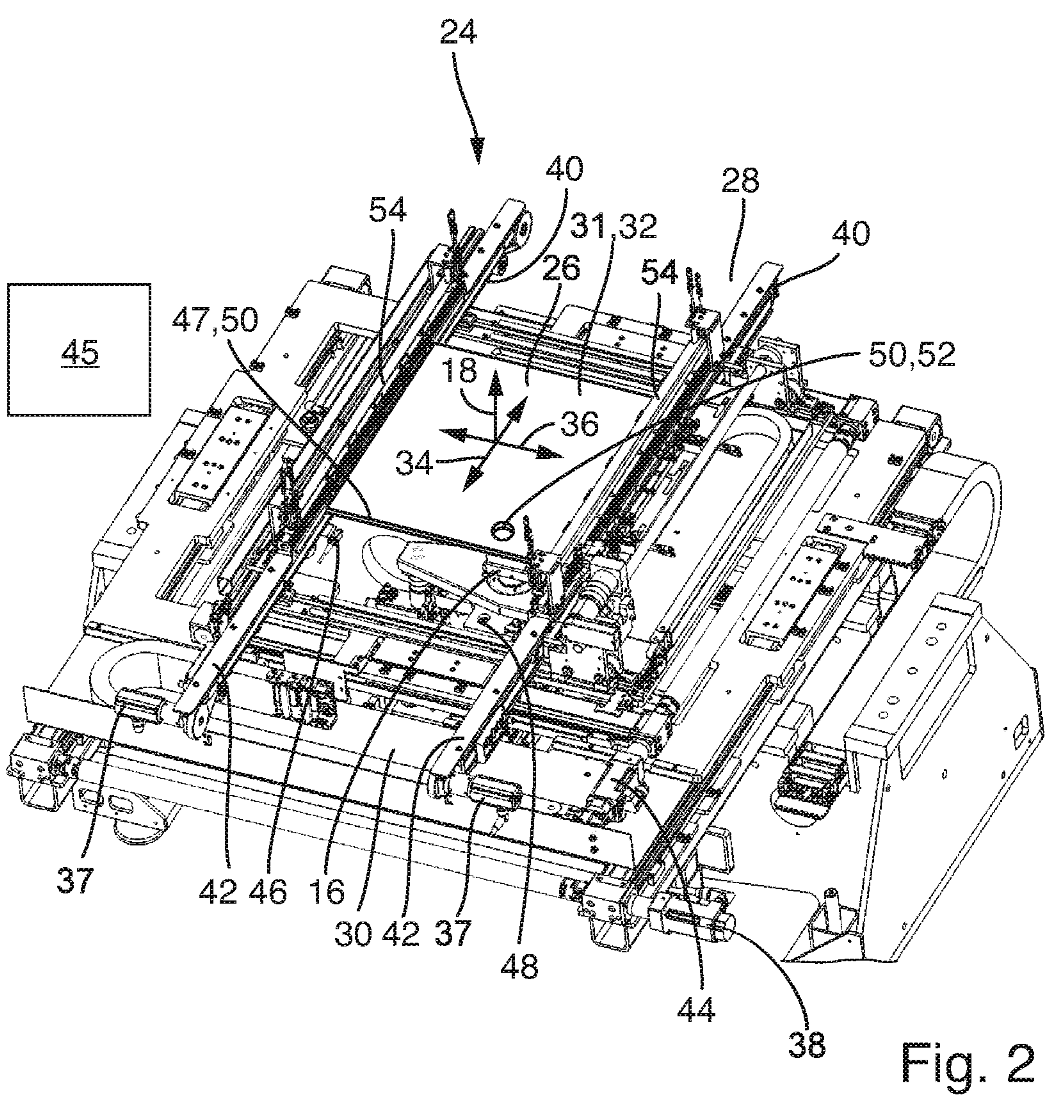
Fig. 2
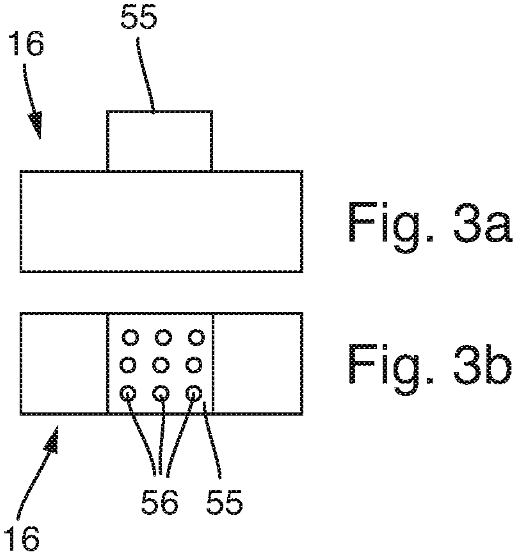
Fig. 3a
Fig. 3b

PRESS-IN MACHINE FOR PRESSING COMPONENTS INTO A SUBSTRATE, IN PARTICULAR INTO A PRINTED CIRCUIT BOARD OR CARRIER PLATE, WITH SUBSTRATE POSITIONING

CROSS-REFERENCE TO RELATED APPLICATION

The present application relates and claims priority to German Patent Application No. 10 2021 128 724.3 filed with the German Patent Office on Nov. 4, 2021, the entirety of which is hereby incorporated by reference.

BACKGROUND

The invention relates to a press-in machine for pressing electrical, electronic, mechanical and/or electromechanical components into a substrate, in particular into a printed circuit board or carrier plate.

Such press-in machines are regularly used in the production of a large number of identical printed circuit boards or carrier plates equipped with electrical, electronic, mechanical and/or electromechanical components. The pressing of the components into printed circuit boards or carrier plates represents in particular an alternative to soldering the components. In particular, it has the advantage that no melting of soldering tin is required, that no resulting process gas has to be discharged and that overall the joining process is subject to a comparatively lower energy consumption.

The pins provided on the electrical, electronic, mechanical and/or electromechanical components are pressed into metalized holes or bores provided on the substrate when pressed in. An overpressing occurring during the press-in can either be absorbed by the deformation in the metalized hole or by the deformation of the pin. Overall, a quite reliable and also stable connection results. The press-in can be carried out in particular such that the metal partners are joined by cold welding.

It has been found that the requirements for pressing components into a substrate such as printed circuit boards or carrier plates are increasing. In particular, the positioning of the substrates with the components in the press-in position, in which the components are then pressed into the substrates, must be done relatively precisely in order to ensure a functionally reliable pressing-in of the joining partners. In this context, it must be taken into account that the pins of the components can pass through the substrates when pressed in and that the free ends of the pins are normally protruding on the side of the substrates facing away from the components during or after the press-in.

It has also been found that it is desirable to use press-in machines flexibly, in particular for pressing in different components on one and the same substrates or also on different substrates.

In particular when different substrates are to be joined with different components in a press-in machine, it is necessary for the individual substrates to be positioned in a press-in position to be defined in each case before the respective press-in operation in the machine.

SUMMARY OF THE INVENTION

The object of the present invention is to enable the positioning of the substrates in the press-in machine in a simple manner.

The object is achieved by a press-in machine for pressing in electrical, electronic, mechanical and/or electromechanical components.

Such a press-in machine comprises in particular a moving unit that comprises a receptacle for a substrate and with which the substrate can be moved in a substrate plane that is spanned by an x-axis and a y-axis, and can be placed in a press-in position, in which one or more components are pressed into the substrate. The x-axis and the y-axis are arranged orthogonally to one another and lie in particular in a horizontal plane.

Furthermore, a lower tool is provided, which can be moved along a z-axis against the underside of the substrate during or before the press-in. The z-axis is in particular arranged orthogonally to the plane of the substrate, i.e., to the x-axis and to the y-axis. The lower tool can also be rigid, and the substrate with the components to be pressed in can be deposited on the lower tool. With the lower tool, forces that arise during the press-in can be absorbed.

Furthermore, an upper tool is provided, which can be moved against the component for pressing the component along the z-axis toward the substrates. Press-in is ultimately effected by means of the upper tool, which presses the component into the substrate, against the underside of which the lower tool is resting for deflecting the press-in forces.

Furthermore, a control unit for controlling the moving unit is provided. The control unit can in particular be designed such that it also controls the movement of the upper tool and the lower tool along the z-axis. Furthermore, a sensor is provided for detecting at least one reference mark provided on the substrate.

The control unit is configured and designed such that it controls the moving unit depending on the detected reference mark in such a way that the substrate is placed between the lower tool and the upper tool in the press-in position. By detecting the reference mark, a defined reference position of the substrate can be determined. The press-in position can be indicated relative to the reference position or reference mark. Then, when the reference position or the reference mark is known, the substrate can be moved in a positionally accurate manner into the press-in position, i.e., into the target position.

Such positioning or placing of the substrate in the press-in position can be done for each of the substrates newly received by the press-in machine. This ensures that the substrate always assumes its press-in position in a positionally precise manner before the press-in process. Overall, this can optimize the press-in and joining processes.

After the press-in, the control unit can then continue to control the moving unit in such a way that the moving unit is moved further into a second or further press-in position, in which a second component or further components placed on the substrate are pressed in. Because the second or further press-in position relative to the first or previous press-in position is known, the control unit can precisely control the moving unit.

Furthermore, it is advantageous if the lower tool has recesses on its upper side facing the upper tool for receiving free ends of the pins of the component that pass through the soldering plate during the press-in. By providing the recesses on the lower tool, the free ends of the pins can dip into the recesses of the lower tool during the press-in process. This has the advantage that the press-in process is not hindered by the free ends hitting against the lower tool. The quality of the press-in and the joining connection can also be increased as a result.

Especially if the pins penetrating the substrate project on the underside of the substrate after the press-in operation, precise positioning and placement of the substrate in the press-in position is required before the press-in. Only in this way can it be ensured that the free ends of the pins can actually dip into the recesses on the upper side of the lower tool.

The upper tool can be adapted to the geometry of the component to be pressed in on its underside facing the lower tool. However, it is also conceivable for the design of the underside of the upper tool to be flat and recess-free.

It has been found to be advantageous if the reference mark is a substrate edge. The substrate can consequently be fed to the press-in machine, and the substrate edge can be detected by the sensor. Based on the detected reference mark, the substrate can then be moved into the press-in position.

It is also conceivable that the reference mark is a fiducial mark that is present on the substrate. Such fiducial marks are known on printed circuit boards in order to serve as optical reference points for the automated machining of the printed circuit board, in particular for the introduction of bores or vias.

A further, particularly preferred embodiment of the invention provides that the reference mark detected by the sensor is a reference bore present on the substrate. The sensor is then designed such that it can detect the reference points, and in particular the center axis or center point thereof. The reference bore can have, for example, a predefined diameter that can be detected by the sensor, whereby the sensor can then deduce the center axis or the center point. After the detection of the reference bore, the substrate is preferably moved further such that the reference bore is located centrally below the sensor, i.e., the sensor center axis and the central axis of the reference bore correspond or are aligned along a common straight line. The substrate then assumes its reference position. After that, the substrate, starting from the reference position of the substrate, can be moved relative to the reference position into the press-in position.

Furthermore, it is advantageous if the control unit is further configured and designed in such a way that during the movement of the receptacle along the x-axis in the direction of travel the sensor detects, for example, a substrate edge of a substrate present in the receptacle that is in the front with respect to the direction of travel, and that, depending on the detected substrate edge, the moving unit is further controlled in such a way that the receptacle is moved in the substrate plane along the x-axis and/or the y-axis such that the reference mark is located within the detection region of the sensor. It is advantageous if the position and the distance of the reference mark from the substrate edge are known. After the substrate edge has been acquired, the reference mark can be "searched" in a predetermined region by corresponding exiting of the region.

Accordingly, various steps are therefore conceivable: In a first step, the substrate edge is detected. In particular, it can thus be detected that a substrate has been fed to the press-in machine and is present. Especially when the location of the reference mark on the substrate with respect to the substrate edge is stored, the substrate can be moved in a second step such that the reference mark is located in the detection region of the sensor. There, the reference mark can then be detected in a third step and, starting from the reference mark, the substrate can be moved in a fourth step into the target or press-in position by means of the moving unit. In a subsequent step, the press-in can then take place.

Furthermore, it is advantageous if the substrates have metalized through-holes, wherein the reference bore in the substrate is such that it has been produced in the machining operation for the substrate in which through-holes for receiving pins of the components are introduced into the substrate. This has the advantage that both the through-holes and the reference bore have been produced in the same machining operation, and in particular in the same clamping of the substrate. This ensures that the positions of the reference bore relative to the through-holes are comparatively accurate. The position of the through-holes can consequently be reliably deduced from the position of the reference bore. Thus, if the substrate is moved into the press-in position, it is thus ensured that the through-holes assume an exact position relative to the reference bore and that ultimately the press-in process can be carried out with a precisely positioned substrate.

The sensor as such can be designed in particular as an optoelectronic sensor or as a camera. In particular, a light barrier sensor can be used as optoelectronic sensor. A CCD camera in which the reference position can be deduced by means of pattern recognition methods can in particular be used as the camera.

Furthermore, it is advantageous if the moving unit and/or the control unit are configured such that an acceleration and/or braking of the receptacle along the x-axis and/or y-axis takes place in such a way that components present on the substrate do not change their position on the substrate before they are pressed in during the acceleration and/or braking of the receptacle. The acceleration and braking thus take place in particular such that the components do not tilt over on the substrate before they are pressed during the braking or acceleration process. A secure positioning of the components on the substrate and a secure press-in of the components into the substrate can also take place as a result.

The aforementioned object is also achieved by a method for operating a press-in machine for pressing components into a substrate, in particular for operating a press-in machine according to the invention that has the features of claim 10.

The method is characterized in that at least one reference mark present on the substrate is detected by the sensor and in that the moving unit is placed in the press-in position between the lower tool and the upper tool depending on the detected reference mark.

Consequently, the reference position of the substrate is known by detecting the reference mark. From the reference position or the actual position of the substrate, the substrate can then be moved into the target position, i.e., into the press-in position, and placed there for the press-in.

The reference mark can be a substrate edge, a fiducial mark and/or a reference bore.

Furthermore, it is advantageous if, in a first step, when the substrate is moved along the x-axis in the direction of travel, for example, the front substrate edge in the direction of travel is detected, when in a second step, depending on the detected substrate, the substrate is moved in the substrate plane along the x-axis and/or the y-axis in such a way that the reference mark is located in the detection region of the sensor. In a third step, the reference mark can be detected and, in a fourth step, the substrate can be moved into the press-in position. In a fifth step, the press-in can take place. Overall, the substrate can thereby be positioned reliably in the press-in machine for the press-in.

Further details and advantageous embodiments of the invention can be found in the following description, on the basis of which an exemplary embodiment of the invention is described and explained in more detail.

BRIEF DESCRIPTION OF THE DRAWINGS

The drawings show:

FIG. 2 the moving unit of the press-in machine according to FIG. 1; and

FIGS. 3*a* and 3*b* are side elevation and plan views, respectively, of a lower tool of the press-in machine according to FIG. 1.

DETAILED DESCRIPTION

Figure 1:
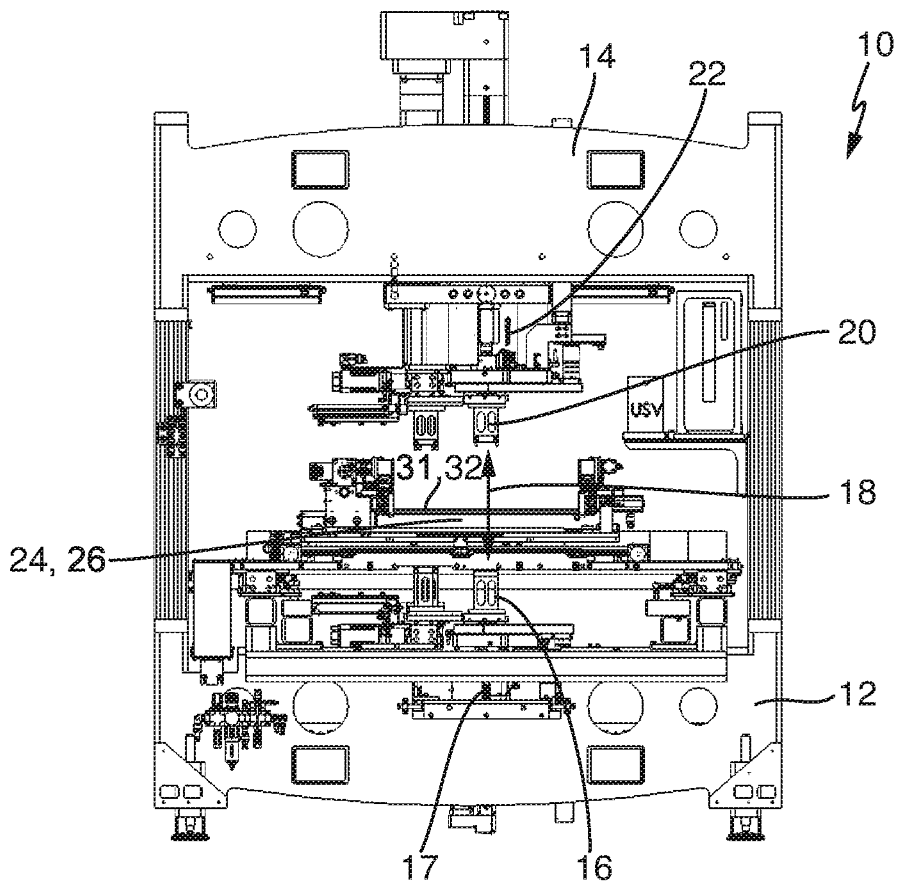
FIG. 1 a press-in machine.

FIG. 1 shows a press-in machine 10 that has a base body 12 and a gantry 14. A lower tool 16 is provided on the base body 12, which is movably arranged with a lower pressing unit 17 along a vertical z-axis 18. An upper tool 20 that interacts with the lower tool 16 during the press-in process is shown on the gantry 14, said upper tool 20 being displaceable along the z axis 18 toward a substrate 31 in the form of a carrier plate or printed circuit board 32 with an upper pressing unit 22 that engages on the gantry 14.

The press-in machine 10 comprises a moving unit 24, which provides a receptacle 26 for the substrate 31 or the printed circuit board 32.

The moving unit 24, which is shown in FIG. 2, has an inlet 28 and an outlet 30, wherein the printed circuit board 32 shown in FIG. 2 can be moved between the inlet 28 and the outlet 30 along an x-axis 34 by means of a transport drive 37 having two motors. The transport drive 37 drives conveyor belts 40 on which the printed circuit board 32 comes to rest. The belts 40 are guided in transport rails 42.

When the circuit boards 32 are moved into the inlet 28, electrical or electronic components are present on the printed circuit board 32, which are pressed into the printed circuit board 32 with the press-in machine 10. Such components are not shown in FIG. 2; the pins of the components can be placed onto metalized through-holes, which are provided in the printed circuit board 32, or can be inserted somewhat.

For the supply of printed circuit boards 32, it is conceivable that upstream of the inlet 28 a feed device is provided with which the printed circuit boards 32 are supplied. To discharge the printed circuit boards 32 after the pressing operation, it is conceivable that a discharge unit is connected downstream of the outlet 30.

With the moving unit 24, the printed circuit board 32 can be moved along the x-axis 34 and along a y-axis 36, which is arranged perpendicular to the x-axis 34 and perpendicular to the z-axis 18. The printed circuit board 32 can consequently be moved with the moving unit 24 in a plane, which is spanned by the x-axis 34 and the y-axis 36.

An x-axis drive 38 is provided for moving the printed circuit board in the receptacle 26 in the x-direction 34. By appropriately controlling the x-axis drive 38, the receptacle 26 together with the printed circuit board can consequently be moved in the x direction 34.

The moving unit 24 also provides a y-axis drive 44, with which the transport rails 42, and thus the printed circuit board 32, can be moved in the y-direction 36. Depending on the control of the x-drive 38 and the y-drive 44, the printed circuit board 32 can consequently be moved freely in the plane defined by the x-axis 34 and the y-axis 36.

Furthermore, a control unit 45, for example a PLC control, is provided, which is schematically indicated in FIG. 2 and serves to control the x-axis drive 38 and the y-axis drive 44. With the control unit 45, the upper tool 20 and the lower tool 16 can also be moved along the z axis 18 independently of one another and away from one another.

In FIG. 2, a stop sensor 46 is provided in the region of one of the transport rails 42. The stop sensor 46, which can be designed, for example, as a light barrier, detects the entry of a front edge 47 of the printed circuit board 32 during the movement of the printed circuit board from the inlet 28 to the outlet 30.

FIG. 2 shows a further sensor 48, a position sensor, with which a reference mark 50 that is present on the printed circuit board 32 can be detected. The reference mark 50 can be, for example, the front edge 47 or a reference bore 52 in the printed circuit board 32 or a fiducial mark on the printed circuit board 32.

Both the stop sensor 46 and the position sensor 48 are connected to the control unit 45 and supply generated sensor signals to the control unit 45.

For transporting a printed circuit board 32 from the inlet 28 to the outlet 30, the transport drive 37 is controlled by the control unit 45 such that the printed circuit board 32 is moved toward the outlet 30. As soon as the stop sensor 46 detects the front edge 47 of the printed circuit board 32, the transport drive 37 is stopped. Because the stopping does not take place abruptly so as to prevent the components from falling over, the printed circuit board is moved somewhat beyond the stop sensor 46 until it ultimately comes to a standstill.

The printed circuit board 32 is then fixed in the moving unit 24 by means of fixing means 54, so that it cannot escape upward or downward in the z-direction 18. The fixing means 54 can be clamping elements or clamping springs, which act against the printed circuit board 32.

In a next step, the printed circuit board 32 is moved in the x-direction 34 and y-direction 36 until the sensor 48 detects the reference mark 50. Because the distance from the front edge 47 to the reference mark 50 is known, the printed circuit board 32 can be moved with the moving unit 24 in a targeted manner into the region where the reference mark 50 is present.

The sensor 48 can be, for example, an optoelectronic sensor, such as a light barrier or a camera, which detects the reference mark 50. If the sensor 48 has detected the reference mark 50, a defined reference position or actual position of the printed circuit board 32 is known. Starting from this reference position, the printed circuit board 32 can be moved in a next step in the x-direction 34 and y-direction 36 into a desired position, namely into the press-in position, in which components present on the printed circuit board 32 are pressed in by means of the tools 16 and 20. This is possible because the press-in position relative to the reference position or reference mark is known and is stored accordingly. The control unit 45 is thus configured such that it controls the x-drive 38 and the y-drive 44 in such a way that the printed circuit board 32 is placed starting from the reference position between the lower tool 16 and the upper tool 20 in the press-in position that is known relative to the reference position.

After reaching the press-in position, the lower tool 16 is moved along the z-axis against the underside of the printed circuit board 32, so that the tool 16 comes to rest against the printed circuit board 32. The press-in is ultimately carried out by the upper tool 20 by the component being pressed into the printed circuit board 32, while the lower tool 16 deflects press-in forces into the base body 12 on the underside of the circuit board 32. Consequently, one or more components placed on the printed circuit board 32 can be pressed into the printed circuit board 32 by means of the tools 16 and 20 simultaneously or sequentially by moving the printed circuit board 32 into different press-in positions.

Even if two different sensors 46 and 48 are shown in FIG. 2, it is conceivable for the sensor 48 also to assume the task of the stopper sensor 46, namely to determine whether the front edge 47 has traveled over the sensor 48, so that the transport drive 37 is then stopped.

As already mentioned, the reference mark 50 can be the front edge 47 of the printed circuit board. However, it has been shown that printed circuit boards 32 can have production-related size deviations of a few tenths of a millimeter, and that this is too imprecise for precise positioning of the press-in position. Therefore, it is advantageous to provide a reference bore 52 as a reference mark, the position of which bore with respect to the metalized through-holes present in the printed circuit board 32, in which the pins of the electronic components are inserted is comparatively accurate. In particular, the position of the reference bore 52 with respect to the through-holes of the printed circuit board 32 is very accurate when the reference bore 52 is created in the same machining operation as the through-holes of the printed circuit board 32.

FIG. 3 shows the lower tool 16 as a single part in a side view (FIG. 3 *a*) and in plan view (FIG. 3*b*). On its upper side 55 facing the upper tool 20, the lower tool 16 provides recesses 56 in the form of blind holes that have a diameter of 1/10 to 1.5 millimeters. The recesses 56 serve to receive free ends of the pins of the electronic components passing through the printed circuit board 32 during the press-in. By providing the recesses 56, it is ensured that the free ends do not impede the press-in operation when the components are pressed into the printed circuit board 32, but can dip into the recess 56. Therefore, because it is also ensured that during the press-in process the free ends of the pins can dip into the recesses 56, it is necessary to move the printed circuit board 32 relatively precisely into the press-in position before the press-in and to place it there.

The moving unit 24 or the drives 38 and 44 thereof is/are controlled by the control unit 45 in such a way that an acceleration and braking of the receptacle 24 takes place in such a way that components present on the printed circuit board 32 do not change their position on the printed circuit board before being pressed in during acceleration and/or during braking of the receptacle 24, and in particular do not tip over.

What is claimed is:

1. A press-in machine for pressing at least one of an electrical, electronic, mechanical and electromechanical component into a substrate, comprising:

a. a moving unit, which comprises a receptacle for the substrate and with which the substrate can be moved in a plane that is spanned by an x-axis and a y-axis and can be placed in a press-in position in which one or more components are pressed into the substrate, b. a lower tool, which comes to rest against the underside of the substrate before or during the press-in, c. an upper tool, which can be moved against the one or more components for pressing the one or more components along the z-axis toward the substrate, d. a control unit for controlling the moving unit, and e. a sensor for detecting at least one reference mark present on the substrate, f. wherein the control unit is configured and designed such that it controls the moving unit depending on the detected reference mark in such a way that the substrate is placed between the lower tool and the upper tool in the press-in position.

2. The press-in machine according to claim 1, characterized in that the lower tool has recesses on its upper side facing the upper tool for receiving free ends of pins of the one or more components passing through the substrate when pressed in.

3. The press-in machine according to claim 1, characterized in that the reference mark detected by the sensor is a substrate edge.

4. The press-in machine according to claim 1, characterized in that the reference mark detected by the sensor is a fiducial mark present on the substrate.

5. The press-in machine according to claim 1, characterized in that the reference mark detected by the sensor is a reference bore present on the substrate.

6. The press-in machine according to claim 5, wherein the substrate has metallized through-holes, and wherein the reference bore in the substrate has been produced in a machining operation for the substrate in which holes for receiving pins of the one or more components have been introduced into the substrate.

7. The press-in machine according to claim 1, characterized in that the control unit is further configured and designed in such a way that the sensor detects a substrate edge of a substrate present in the receptacle during the movement of the receptacle along the x-axis, and in that, depending on the detected substrate edge, the moving unit is controlled further in such a way that the receptacle is moved in the plane of the substrate along the x-axis and/or the y-axis such that the reference mark is located in the detection region of the sensor.

8. The press-in machine according to claim 1, characterized in that the sensor is an optoelectronic sensor or a camera.

9. The press-in machine according to claim 1, characterized in that the moving unit and/or the control unit are configured such that an acceleration and/or braking of the receptacle takes place in such a way that the one or more components present on the substrate do not change their position on the substrate prior to the press-in during the acceleration and/or braking of the receptacle.

10. A method for operating a press-in machine for pressing at least one of an electrical, electronic, mechanical and electromechanical component into a substrate, wherein the press-in machine comprises a moving unit, which comprises a receptacle for the substrate and with which the substrate can be moved in a plane, which is spanned by an x-axis and a y-axis and can be placed in a press-in position, a lower tool, which comes to rest against the underside of the substrate before or during the press-in, an upper tool, which can be moved against one or more components in order to press the one or more components along a z-axis toward the substrate, and a sensor for detecting at least one reference mark present on the substrate, the method comprising the steps of:

a. detecting at least one reference mark present on the substrate by the sensor, and b. placing the moving unit in the press-in position depending on the detected reference mark between the lower tool and the upper tool.

11. The method according to claim 10, comprising the step of detecting a fiducial mark and/or a reference bore as a reference mark in a printed circuit board substrate.

12. The method according to claim 10, comprising the steps of:

a. detecting a substrate edge when the substrate is moved along the x-axis in the direction of travel, b. depending on the detected substrate edge, moving the substrate in the plane such that the reference mark is located in the detection region of the sensor, c. detecting the reference mark, d. moving the substrate into the press-in position, and e. pressing one or more components into the substrate.

* * * * *